(12) United States Patent
Huang et al.

(10) Patent No.: US 10,143,079 B2
(45) Date of Patent: Nov. 27, 2018

(54) BREATHABLE AND ELECTRICALLY CONDUCTIVE CLOTH

(71) Applicants: Chen-Cheng Huang, Taipei (TW); Pao-Hao Huang, Taipei (TW); Pao-Han Huang, Taipei (TW)

(72) Inventors: Chen-Cheng Huang, Taipei (TW); Pao-Hao Huang, Taipei (TW); Pao-Han Huang, Taipei (TW)

( * ) Notice: Subject to any disclaimer, the term of this patent is extended or adjusted under 35 U.S.C. 154(b) by 58 days.

(21) Appl. No.: 15/371,324

(22) Filed: Dec. 7, 2016

(65) Prior Publication Data

US 2017/0171959 A1  Jun. 15, 2017

(30) Foreign Application Priority Data

Dec. 10, 2015 (TW) .............................. 104141444 A

(51) Int. Cl.
| | | |
|---|---|---|
| A41D 1/00 | (2018.01) | |
| B32B 3/26 | (2006.01) | |
| B32B 3/30 | (2006.01) | |
| H05K 1/02 | (2006.01) | |
| H05K 1/03 | (2006.01) | |
| A41D 31/00 | (2006.01) | |
| A41D 31/02 | (2006.01) | |
| B32B 27/12 | (2006.01) | |
| B32B 27/32 | (2006.01) | |
| B32B 27/36 | (2006.01) | |

(52) U.S. Cl.
CPC ............. *H05K 1/028* (2013.01); *A41D 1/005* (2013.01); *B32B 3/266* (2013.01); *B32B 3/30* (2013.01); *B32B 27/12* (2013.01); *B32B 27/32* (2013.01); *B32B 27/36* (2013.01); *H05K 1/0306* (2013.01); *H05K 1/038* (2013.01); *A41D 31/0038* (2013.01); *A41D 31/02* (2013.01); *A41D 2400/22* (2013.01); *B32B 2250/02* (2013.01); *B32B 2255/10* (2013.01); *B32B 2274/00* (2013.01); *B32B 2307/51* (2013.01); *B32B 2307/724* (2013.01); *B32B 2437/00* (2013.01); *B32B 2457/08* (2013.01); *H05K 2201/029* (2013.01); *H05K 2201/0969* (2013.01)

(58) Field of Classification Search
CPC ........... B32B 27/12; B32B 3/266; B32B 3/30; H05K 1/028
See application file for complete search history.

(56) References Cited

U.S. PATENT DOCUMENTS

| | | | | |
|---|---|---|---|---|
| 9,545,163 | B2 * | 1/2017 | Huang | ..................... A47G 5/00 |
| 9,713,914 | B2 * | 7/2017 | Huang | .................... B32B 27/12 |
| 9,877,876 | B2 * | 1/2018 | Huang | ................ B29C 47/0021 |

* cited by examiner

*Primary Examiner* — Hai Vo
(74) *Attorney, Agent, or Firm* — Hamre, Schumann, Mueller & Larson, P.C.

(57) ABSTRACT

A breathable and electrically conductive cloth includes a first plastic film having opposite inner and outer surfaces, an electrical circuit pattern layer formed on the inner surface, and a yarn-based fabric having opposite first and second surfaces and defining multiple micropores extending through the first and second surfaces. The first plastic film has multiple first hollow protrusions respectively extending into the micropores and forming ventilating passages extending through the outer surface and the second surface. The electrical circuit pattern layer has multiple second hollow protrusions correspondingly extending into the micropores.

9 Claims, 5 Drawing Sheets

BREATHABLE AND ELECTRICALLY CONDUCTIVE CLOTH

CROSS-REFERENCE TO RELATED APPLICATION

This application claims priority of Taiwanese Patent Application No. 104141444, filed on Dec. 10, 2015.

FIELD

The disclosure relates to a breathable and electrically conductive cloth, more particularly to a breathable and electrically conductive cloth suitable for making smart clothing.

BACKGROUND

With the advancement of technology, it has been increasingly possible to develop smart clothing, which are essentially wearable fabrics combined with electronic devices that are capable of functions involving communication, health condition monitoring, etc. A conventional way of making the smart clothing involves attaching a flexible printed circuit to the fabric. However, the flexible printed circuit may adversely affect ventilation of the fabric.

It has been proposed to further improve the conventional smart clothing by preparing conductive yarns from carbon fibers, metallic fibers, etc., followed by weaving and interlacing the conductive yarns with common non-conductive yarns to form the improved smart clothing with a circuit. However, application of the conductive yarns may result in increased manufacturing costs and the process is rather complicated. In addition, after long-term use, the conductive yarns may be broken, affecting electrical conductivity of the improved smart clothing. What is more, the improved smart clothing is not waterproof, which limits its use for rainy days.

SUMMARY

Therefore, an object of the present disclosure is to provide a breathable and electrically conductive cloth that can alleviate at least one of the drawbacks associated with the prior art.

According to the present disclosure, a breathable and electrically conductive cloth includes a first plastic film, an electrical circuit pattern layer and a yarn-based fabric.

The first plastic film is electrically insulative, and has an inner surface and an outer surface opposite to the inner surface. The electrical circuit pattern layer is formed on the inner surface of the first plastic film and is adapted to be electrically connected to an external electrical unit. The yarn-based fabric has a first surface and a second surface opposite to the first surface, and defines a plurality of micropores that extend through the first surface and the second surface. The first surface of the yarn-based fabric is bonded to the inner surface of the first plastic film and the electrical circuit pattern layer.

The first plastic film further has a plurality of first hollow protrusions. The electrical circuit pattern layer has a plurality of second hollow protrusions. Each of the first hollow protrusions extends into a corresponding one of the micropores and forms a ventilating passage that extends through the outer surface of the first plastic film and the second surface of the yarn-based fabric. At least one of the first hollow protrusions extends into a corresponding one of the second hollow protrusions. Each of the second hollow protrusions extends into a corresponding one of the micropores.

BRIEF DESCRIPTION OF THE DRAWINGS

Other features and advantages of the present disclosure will become apparent in the following detailed description of the embodiment and variation with reference to the accompanying drawings, of which.

DETAILED DESCRIPTION

Figure 1:
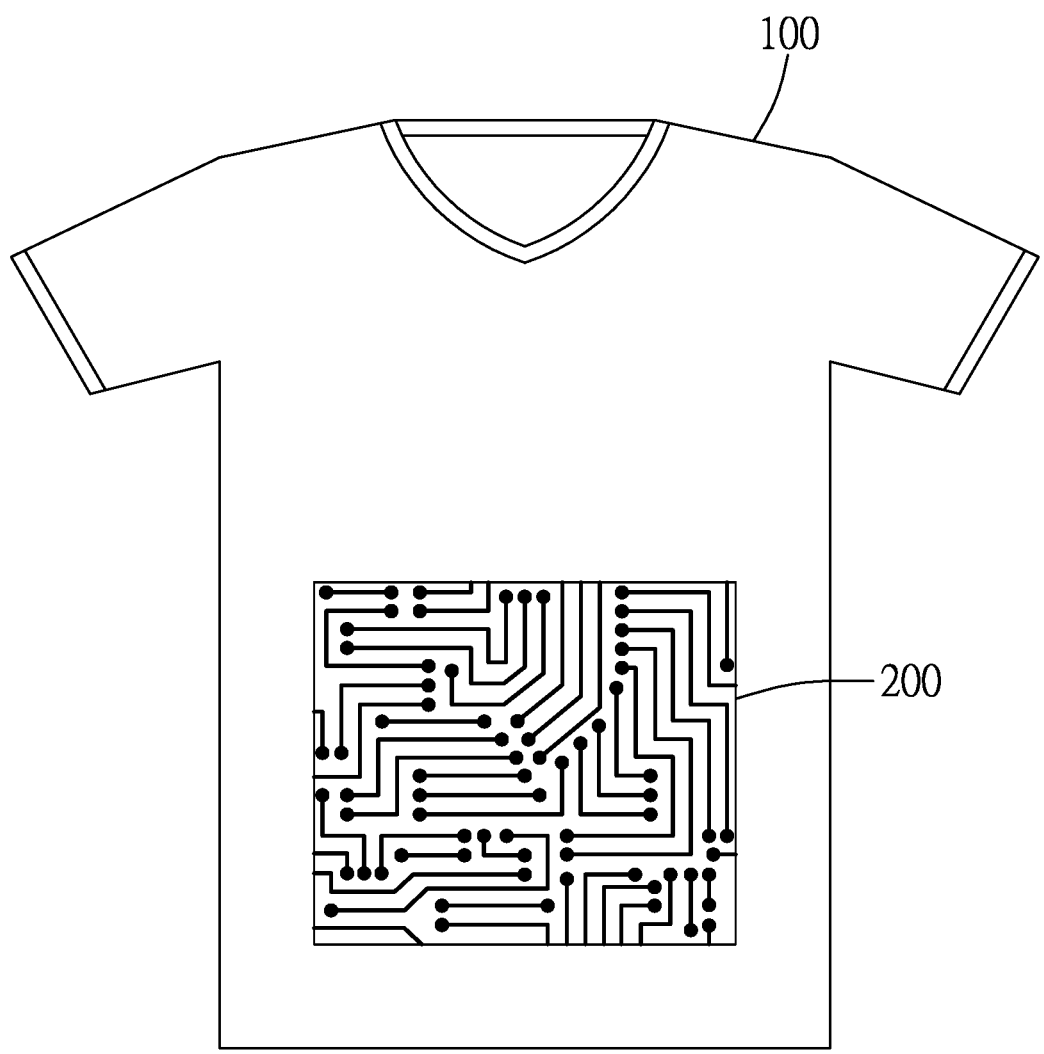
FIG. 1 is a schematic view showing an embodiment of a breathable and electrically conductive cloth according to the present disclosure which is attached to a cloth.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
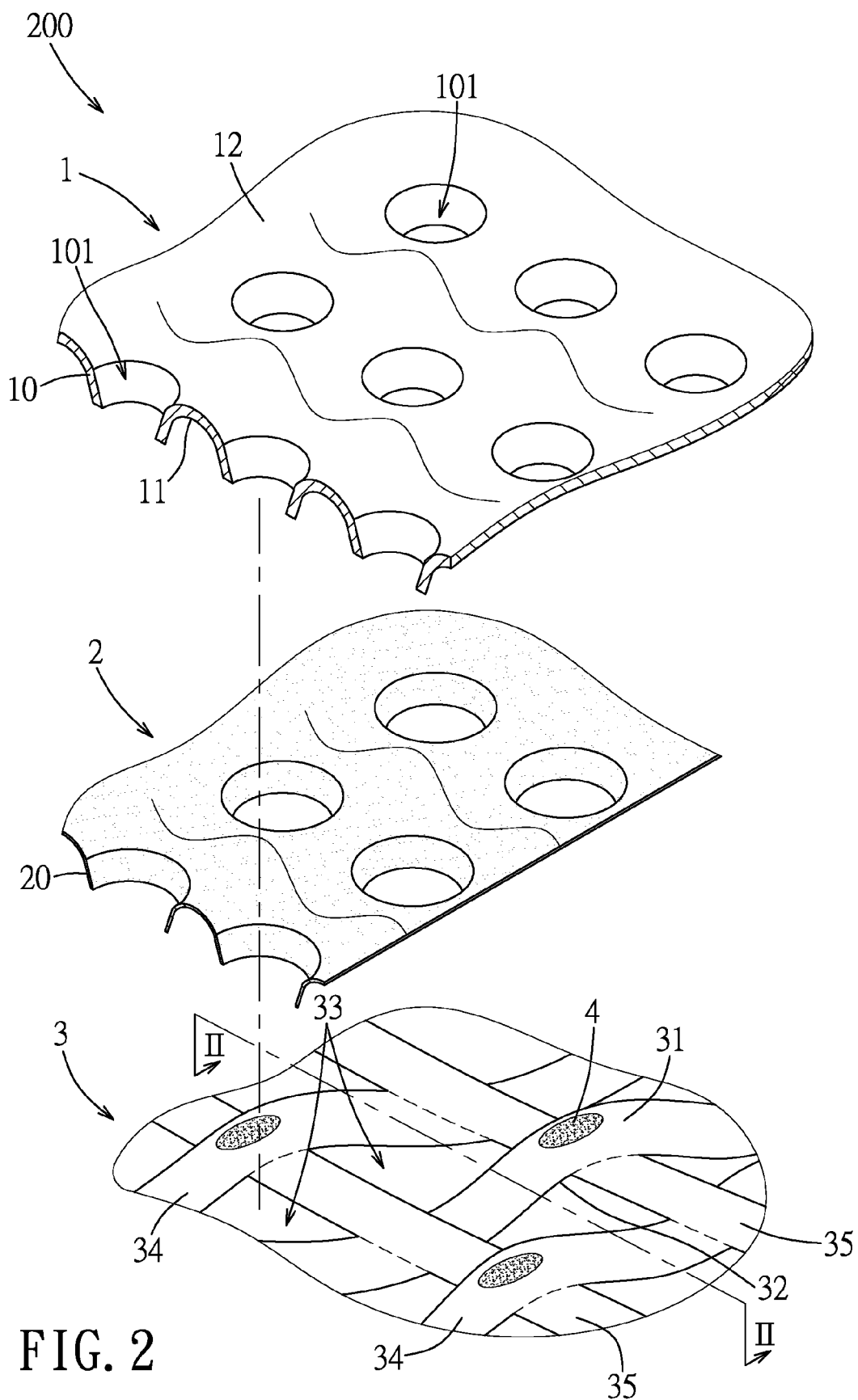
FIG. 2 is a fragmentary exploded perspective view of the embodiment.
Figure 3:
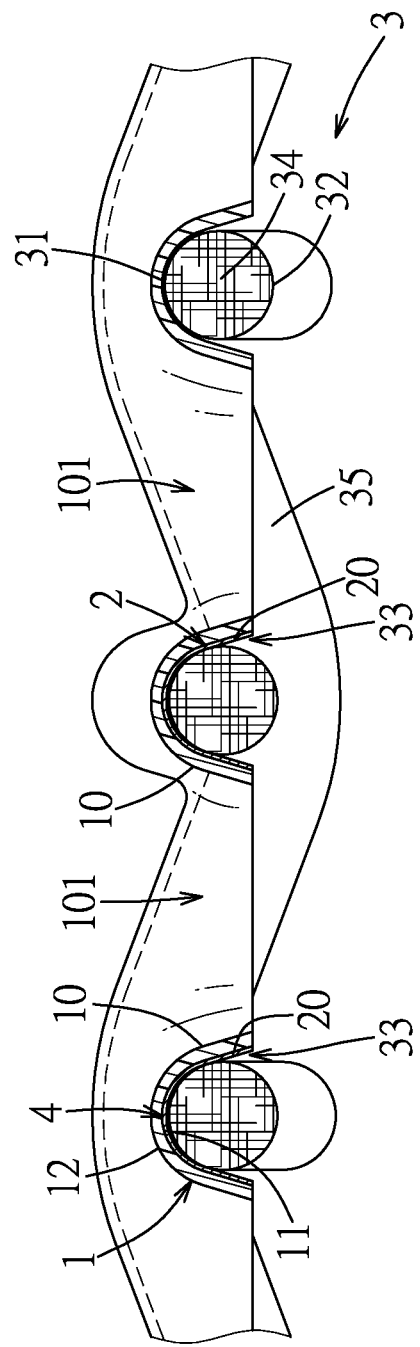
FIG. 3 is a fragmentary cross-sectional view of the embodiment, taken along line II-II of FIG. 2.

Referring to FIGS. 1 to 3, an embodiment of a breathable and electrically conductive cloth 200 according to the present disclosure is illustrated to be attached to a cloth 100 to form a smart clothing. The attaching method may be stitching, gluing, melt bonding, etc. In this embodiment, the breathable and electrically conductive cloth 200 is exemplified to be stitched to the cloth 100.

The breathable and electrically conductive cloth 200 includes a first plastic film 1, an electrical circuit pattern layer 2, a yarn-based fabric 3 and an adhesive layer 4.

Figure 4:
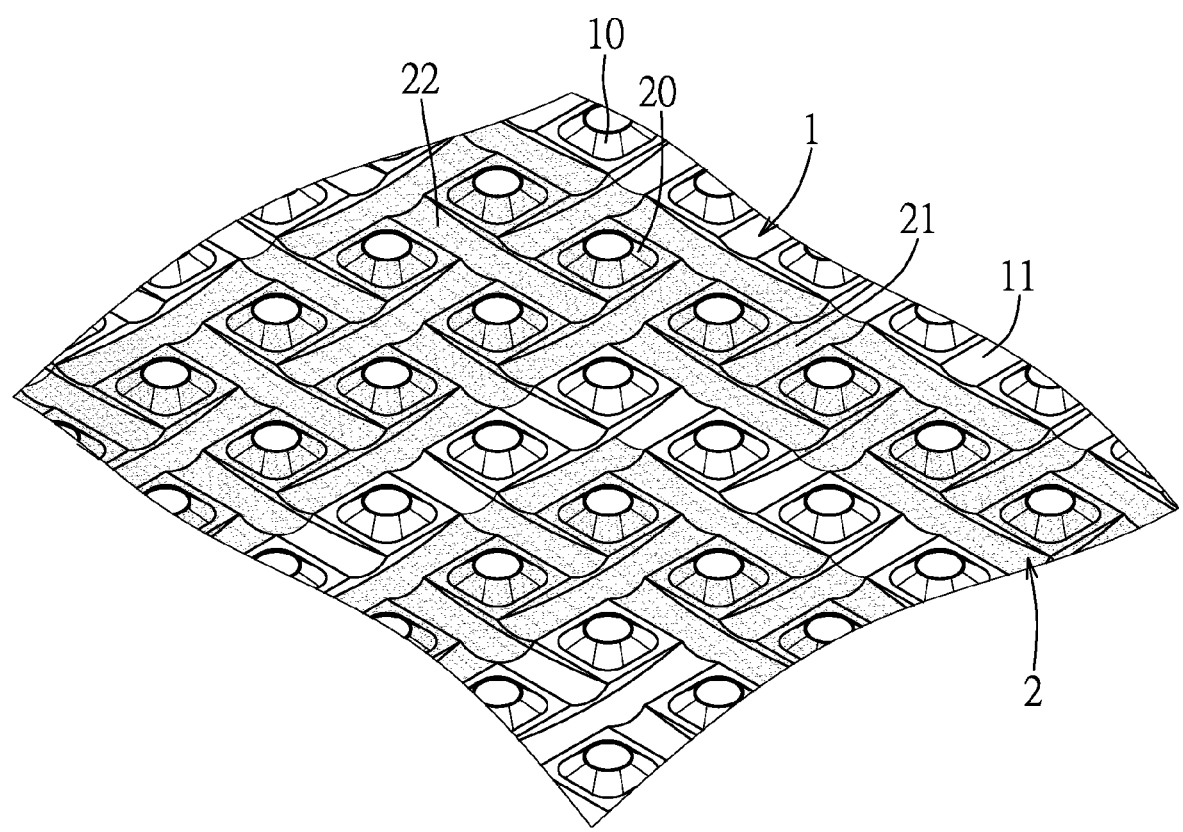
FIG. 4 is a fragmentary bottom view of the embodiment, showing a first plastic film and an electrical circuit pattern layer of the embodiment.

The first plastic film 1 is electrically insulative, and has an inner surface 11 and an outer surface 12 opposite to the inner surface 11. The electrical circuit pattern layer 2 is formed on and partially covers the inner surface 11 of the first plastic film 1, and is adapted to be electrically connected to an external electrical unit (not shown). The electrical unit may be a battery, an integrated circuit chip, a microcontroller unit, etc., and may be changed according to practical applications. The yarn-based fabric 3 has a first surface 31 and a second surface 32 that is opposite to the first surface 31, and defines a plurality of micropores 33 that extend through the first surface 31 and the second surface 32. The first surface 31 of the yarn-based fabric 3 is bonded to the inner surface 11 of the first plastic film 1 and the electrical circuit pattern layer 2 through the adhesive layer 4 disposed therebetween, such that the first plastic film 1 forms a textile texture conforming to the contour of the yarn-based fabric 3. In certain embodiments, the first plastic film 1 is thermally bonded to the yarn-based fabric 3. The first plastic film 1 further has a plurality of first hollow protrusions 10. The electrical circuit pattern layer 2 has a plurality of second hollow protrusions 20. Each of the first hollow protrusions 10 extends into a corresponding one of the micropores 33 and forms a ventilating passage 101 that extends through the outer surface 12 of the first plastic film 1 and the second surface 32 of the yarn-based fabric 3, in such a way that the ventilating passage 101 of each of the first hollow protrusions 10 allows for passage of moisture vapor therethrough while blocking passage of liquids therethrough, making the breathable and electrically conductive cloth 200 not only waterproof but also breathable. At least one of the first hollow protrusions 10 extends into a corresponding one of the second hollow protrusions 20. As shown in FIG. 4, which is a fragmentary bottom view of the embodiment that shows the first plastic film 1 and the electrical circuit pattern layer 2, the first hollow protrusions 10 correspondingly extend into the second hollow protrusions 20 only at the part where the first plastic film 1 is covered by the electrical circuit pattern layer 2. Each of the second hollow protrusions 20 extends into a corresponding one of the micropores 33. In certain embodiments, the ventilating passage 101 of each of the first hollow protrusions 10 is funnel-shaped and is tapered in a direction from the first plastic film 1 to the yarn-based fabric 3. In certain embodiments, the electrical circuit pattern layer 2 is printed on the inner surface 11 of the first plastic film 1.

In certain embodiments, the first plastic film 1 is made of a thermoplastic material selected from the group consisting of polyolefin, polyester, thermoplastic elastomer, and combinations thereof. The electrical circuit pattern layer 2 is made of an electrically conductive ink.

In certain embodiments, the yarn-based fabric 3 includes a plurality of warp yarns 34 and a plurality of weft yarns 35 that are interlaced with the warp yarns 34 to define the micropores 33. Alternatively, the warp yarns 34 and the weft yarns 35 may be knitted together.

The adhesive layer 4 may be dotted or linear shaped so as to avoid interfering with the ventilating passages 101 of the first hollow protrusions 10 and avoid affecting ventilation of the breathable and electrically conductive cloth 200. In this embodiment, the adhesive layer 4 is exemplified to be formed on the warp yarns 34 and may be made from a hot melt adhesive or any other commercially available adhesives.

Referring to FIGS. 2 to 4, the electrical circuit pattern layer 2 further has a plurality of warp ribs 21 that respectively correspond in position to the warp yarns 34, and a plurality of weft ribs 22 that respectively correspond in position to the weft yarns 35. The warp ribs 21 and the weft ribs 22 are connected to each other to cooperatively form the textile texture and cooperatively define the second hollow protrusions 20. In the circumstance that a part of the warp yarns 34 and a part of the weft yarns 35 are broken due to long-term use of the breathable and electrically conductive cloth 200, the unbroken warp yarns 34 and the unbroken weft yarns 35 can maintain electrical conduction of the breathable and electrically conductive cloth 200.

In certain embodiments, the breathable and electrically conductive cloth 200 further includes a functional coating 6 that is formed on the inner surface 11 of the first plastic film 1, which is not covered with the electrical circuit pattern layer 2. The functional coating 6 is made of a material selected from the group consisting of an anti-ultraviolet material, an anti-bacterial material, an anti-electromagnetic material, an anti-static material, and combinations thereof.

The embodiment of the breathable and electrically conductive cloth 200 may be made of a method including:

preparing the yarn-based fabric 3;

forming the adhesive layer 4 on the first surface 31 of the yarn-based fabric 3 by a glue dispensing technique;

printing the electrically conductive ink on a part of the inner surface 11 of the first plastic film 1 to form the electrical circuit pattern layer 2;

coating a functional material on a part of the inner surface 11 of the first plastic film 1 that is not covered with the electrical circuit pattern layer 2 to form the functional coating 6;

bonding the first surface 31 of the yarn-based fabric 3 to the inner surface 11 of the first plastic film 1, the electrical circuit pattern layer 2 and the functional coating 6 through the adhesive layer 4 to form a pre-formed cloth;

placing the pre-formed cloth onto a screen mold (not shown);

heating the pre-formed cloth to soften the first plastic film 1;

using a vacuum forming machine (not shown) to form the first hollow protrusions 10 and the second hollow protrusions 20 while the first plastic film 1 is thermally bonded to the yarn-based fabric 3 to form the breathable and electrically conductive cloth 200; and cooling the breathable and electrically conductive cloth 200 and then removing the breathable and electrically conductive cloth 200 from the screen mold.

In certain embodiments, the electrically conductive ink may include the functional material.

Figure 5:
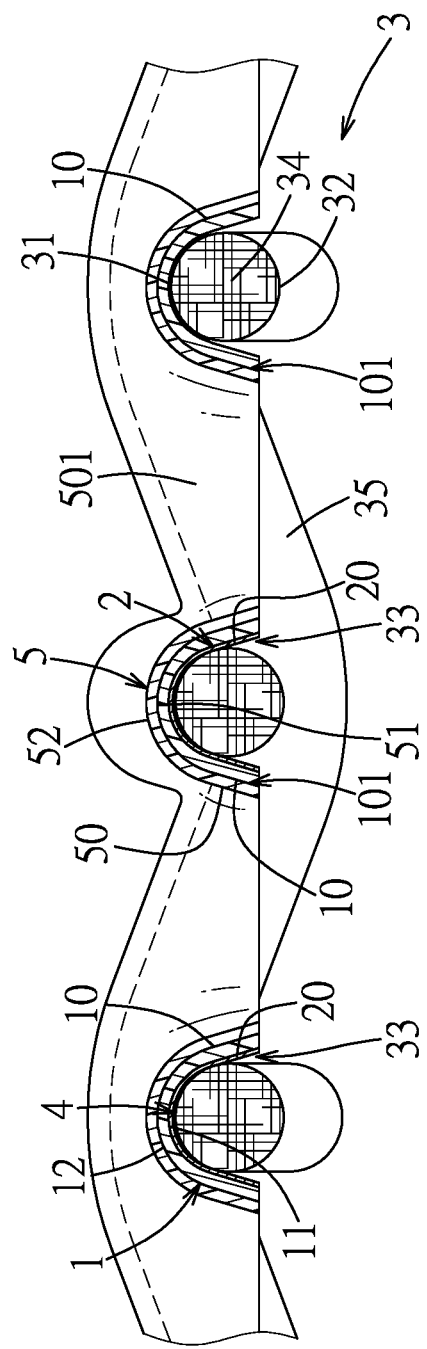
FIG. 5 is a fragmentary cross-sectional view of a variation of the embodiment.

Referring to FIG. 5, a variation of the embodiment of the breathable and electrically conductive cloth 200 according to the present disclosure further includes a second plastic film 5 that has an inner surface 51 attached to the outer surface 12 of the first plastic film 1 and an outer surface 52 opposite to the inner surface 51, and that is formed with a plurality of third hollow protrusions 50. Each of the third hollow protrusions 50 of the second plastic film 5 extends into a corresponding one of the first hollow protrusions 10, and forms a ventilating passage 501 that extends through the inner surface 51 and the outer surface 52 of the second plastic film 5 and that is in spatial communication with a corresponding one of the ventilating passages 101 of the first hollow protrusions 10. The third hollow protrusions 50 are formed by the above mentioned vacuum forming step. It is worth mentioning that each of the third hollow protrusions 50 has a diameter smaller than that of the corresponding one of the ventilating passages 101, thereby improving waterproof properties of the breathable and electrically conductive cloth 200 while maintaining ventilation properties of the breathable and electrically conductive cloth 200.

In this disclosure, the minimum dimension of the funnel-shaped ventilating passages 101 may be adjusted by changing the thickness of the first plastic film 1 and the dimension of the micropores 33 of the yarn-based fabric 3. Moreover, the height of the first hollow protrusions 10 and the second hollow protrusions 20 may be adjusted by changing the dimension of the micropores 33 of the yarn-based fabric 3. In addition, the density of the first hollow protrusions 10 and the second hollow protrusions 20 may be adjusted by changing the density of holes on the screen mold. Also, when the minimum dimensions of the first hollow protrusions 10 and the second hollow protrusions 20 are fixed, the ventilation of the breathable and electrically conductive cloth 200 can be increased by increasing the density of the first hollow protrusions 10 and the second hollow protrusions 20. Furthermore, the waterproof properties of the breathable and electrically conductive cloth 200 may be adjusted by forming a certain number of blind holes (not shown) in the first plastic film 1 to replace part of the first hollow protrusions 10.

In summary, with formation of the first hollow protrusions 10 of the first plastic film 1 and the second hollow protrusions 20 of the electrical circuit pattern layer 2, the breathable and electrically conductive cloth 200 according to the present disclosure can be waterproof while maintaining a certain degree of ventilation properties. Moreover, with the inclusion of the electrical circuit pattern layer 2, electrical conductivity of the breathable and electrically conductive cloth 200 can be maintained even if a part of the warp yarns 34 and a part of the weft yarns 35 of the yarn-based fabric 3 are broken. What is more, the breathable and electrically conductive cloth 200 can be easily mass-produced and associated with lower manufacturing costs by techniques such as continuous roll printing, melt bonding, vacuum forming, etc.

In the description above, for the purposes of explanation, numerous specific details have been set forth in order to provide a thorough understanding of the embodiment and variation. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what are considered the exemplary embodiment and variation, it is understood that this disclosure is not limited to the disclosed embodiment and variation but is intended to cover various arrangements included within the spirit and scope of the broadest interpretation so as to encompass all such modifications and equivalent arrangements.

What is claimed is:

1. A breathable and electrically conductive cloth comprising:
   a first plastic film that is electrically insulative, and that has an inner surface and an outer surface opposite to said inner surface;
   an electrical circuit pattern layer that is formed on said inner surface of said first plastic film, and that is adapted to be electrically connected to an external electrical unit; and
   a yarn-based fabric that has a first surface and a second surface opposite to said first surface, said yarn-based fabric having a plurality of warp yarns and a plurality of weft yarns that are interlaced with the warp yarns to form a plurality of micropores, said micropores extending through said first surface and said second surface, said first surface of said yarn-based fabric being bonded to said inner surface of said first plastic film and said electrical circuit pattern layer,
   wherein said first plastic film further has a plurality of first hollow protrusions, said electrical circuit pattern layer having a plurality of warp ribs and a plurality of weft ribs that are interlaced with said warp ribs to form a plurality of second hollow protrusions, each of said first hollow protrusions extending into a corresponding one of said micropores and forming a ventilating passage that extends through said outer surface of said first plastic film and said second surface of said yarn-based fabric, at least one of said first hollow protrusions extending into a corresponding one of said second hollow protrusions, each of said second hollow protrusions extending into a corresponding one of said micropores.

2. The breathable and electrically conductive cloth as claimed in claim 1, wherein said ventilating passage of each of said first hollow protrusions is funnel-shaped and is tapered in a direction from said first plastic film toward said yarn-based fabric.

3. The breathable and electrically conductive cloth as claimed in claim 1, wherein said first plastic film is made of a thermoplastic material selected from the group consisting of polyolefin, polyester, thermoplastic elastomer, and combinations thereof.

4. The breathable and electrically conductive cloth as claimed in claim 1, wherein said first plastic film is thermally bonded to said yarn-based fabric.

5. The breathable and electrically conductive cloth as claimed in claim 1, further comprising a functional coating formed on said inner surface of said first plastic film.

6. The breathable and electrically conductive cloth as claimed in claim 5, wherein the functional coating is made of a material selected from the group consisting of an anti-ultraviolet material, an anti-bacterial material, an anti-electromagnetic material, an anti-static material, and combinations thereof.

7. The breathable and electrically conductive cloth as claimed in claim 1, further comprising a second plastic film that is attached to said outer surface of said first plastic film, and that is formed with a 5 plurality of third hollow protrusions, each of said third hollow protrusions of said second plastic film extending into a corresponding one of said first hollow protrusions.

8. A breathable and electrically conductive cloth comprising:
   a first plastic film that is electrically insulative, and that has an inner surface and an outer surface opposite to said inner surface;
   an electrical circuit pattern layer that has an ink layer printed on said inner surface of said first plastic film, and that is adapted to be electrically connected to an external electrical unit; and
   a yarn-based fabric that has a first surface and a second surface opposite to said first surface, said yarn-based fabric having a plurality of warp yarns and a plurality of weft yarns that are interlaced with said warp yarns to form a plurality of micropores, said micropores extending through said first surface and said second surface, said first surface of said yarn-based fabric being bonded to said inner surface of said first plastic film and said electrical circuit pattern layer,
   wherein said first plastic film further has a plurality of first hollow protrusions, said electrical circuit pattern layer having a plurality of warp ribs and a plurality of weft ribs that are interlaced with said warp ribs to form a plurality of second hollow protrusions, each of said first hollow protrusions coincides with each of said second hollow protrusions, and each of the second hollow protrusions extends into a corresponding one of said micropores.

9. The breathable and electrically conductive cloth as claimed in claim 8, wherein said ink layer of said electrical circuit pattern layer is made of an electrically conductive ink.

* * * * *